United States Patent
Masleid et al.

(10) Patent No.: US 9,036,447 B2
(45) Date of Patent: May 19, 2015

(54) DECODER CIRCUIT WITH REDUCED CURRENT LEAKAGE

(71) Applicant: Oracle International Corporation, Redwood City, CA (US)

(72) Inventors: Robert P. Masleid, Monte Sereno, CA (US); Johan Bastiaens, Santa Clara, CA (US)

(73) Assignee: Oracle International Corporation, Redwood Shores, CA (US)

( * ) Notice: Subject to any disclaimer, the term of this patent is extended or adjusted under 35 U.S.C. 154(b) by 205 days.

(21) Appl. No.: 13/719,773

(22) Filed: Dec. 19, 2012

(65) Prior Publication Data

US 2014/0169117 A1 Jun. 19, 2014

(51) Int. Cl.
  *G11C 8/10* (2006.01)
  *G11C 8/00* (2006.01)
(52) U.S. Cl.
  CPC ........................................ *G11C 8/10* (2013.01)
(58) Field of Classification Search
  CPC ................................ G11C 8/10; G11C 11/418
  USPC ........................ 365/230.06, 189.06, 230.03
  See application file for complete search history.

(56) References Cited

U.S. PATENT DOCUMENTS

| | | | |
|---|---|---|---|
| 6,621,743 B2 | 9/2003 | Ogane | |
| 6,914,848 B2 | 7/2005 | Jamshidi et al. | |
| 7,577,054 B2 | 8/2009 | Nakamura | |
| 7,826,301 B2 | 11/2010 | Dudeck et al. | |
| 8,164,972 B1 * | 4/2012 | Su | 365/230.08 |
| 2009/0086563 A1 * | 4/2009 | Morein | 365/230.06 |
| 2012/0106286 A1 * | 5/2012 | Lee et al. | 365/230.03 |

* cited by examiner

*Primary Examiner* — Vanthu Nguyen
*Assistant Examiner* — Xiaochun L Chen
(74) *Attorney, Agent, or Firm* — Meyertons Hood Kivlin Kowert & Goetzel

(57) ABSTRACT

A decoder circuit with reduced leakage configured to decode an address and drive one of a number of word lines may be implemented with two-high logic gates in a pre-decode stage, a decode stage, and a word line driver stage. Such decoder circuits may include, in the word line driver stage, a number of two-high NOR gates configured to drive one of a number of word lines. In some embodiments, the two-high logic gates that share common inputs are implemented with multi-output static logic.

19 Claims, 4 Drawing Sheets

DECODER CIRCUIT WITH REDUCED CURRENT LEAKAGE

BACKGROUND

1. Technical Field

This disclosure relates to memory address decoders, and more particularly to decoder circuits with reduced current leakage.

2. Description of the Related Art

Modern VLSI (Very Large Scale Integration) chips are power constrained. Leakage power is often one factor that contributes to power utilization in a VLSI chip. Memory array decode word line drivers of a VLSI chips often contribute a large amount of power leakage due to the very large number and width of the inverters that make up the word line driver of a memory array decode word line driver. Prior art techniques for reducing leakage power in decode word line drivers typically revolve around implementing the word line drivers with long channel devices or selecting high voltage threshold devices. Both implementations however, slow the overall decode process.

SUMMARY OF THE EMBODIMENTS

Various embodiments a decoder circuit are disclosed in this specification. In one embodiment, a decoder circuit includes a decode stage configured to decode a plurality of decode input signals into a plurality of word line driver input signals. The decoder circuit also includes a word line driver stage configured to drive a plurality of word lines. In the decoder circuit, the word line driver stage includes a plurality of two-high NOR gates, with each two-high NOR gate configured to receive two of the word line driver input signals and drive a word line based on the word line driver input signals.

In other embodiments, a decoder circuit may include a pre-decode stage, a decode stage, and a word line driver stage. The pre-decode stage may be configured to decode a plurality of address signals into a plurality of decode input signals. The pre-decode stage may also include a plurality of two-high, pre-decode NOR gates and a pair of inverters for each pre-decode NOR gate. The decode stage may be configured to decode the plurality of decode input signals into a plurality of word line driver input signals. In such an embodiment, the decode stage may include a plurality of two-high NAND gates. The word line driver stage may be configured to drive a plurality of word lines and include a plurality of two-high NOR gates. In such an embodiment, each inverter of the pre-decode stage may be configured to receive one of the address signals and provide an inverted address signal to one of the pre-decode NOR gates. Each pre-decode NOR gate may be configured to receive two of the inverted address signals and output a decode input signal based on the received inverted address signals. Each NAND gate may be configured to decode two of the decode input signals and provide one word line driver input signal to one of the two-high NOR gates of the word line driver stage. Each two-high NOR gate of the word line driver stage may be configured to receive two of the word line driver input signals and drive a word line based on the word line driver input signals.

Also disclosed in this specification are various embodiments of systems that include a decoder circuit. Example embodiments may include a memory array and a decoder circuit configured in accordance with any of the example decoder circuits described above.

In other embodiments, a decoder circuit may include a decode stage configured to decode a plurality of decode input signals into a plurality of word line driver input signals, and a word line driver stage configured to drive a plurality of word lines as described above. In the decoder circuit, the word line driver stage includes a plurality of two-high NOR gates, with each two-high NOR gate configured to receive two of the word line driver input signals and drive a word line based on the word line driver input signals.

In any of these example embodiments, any combination of the decode stage and the word line driver stage may include multi-output static logic.

Figure 1:
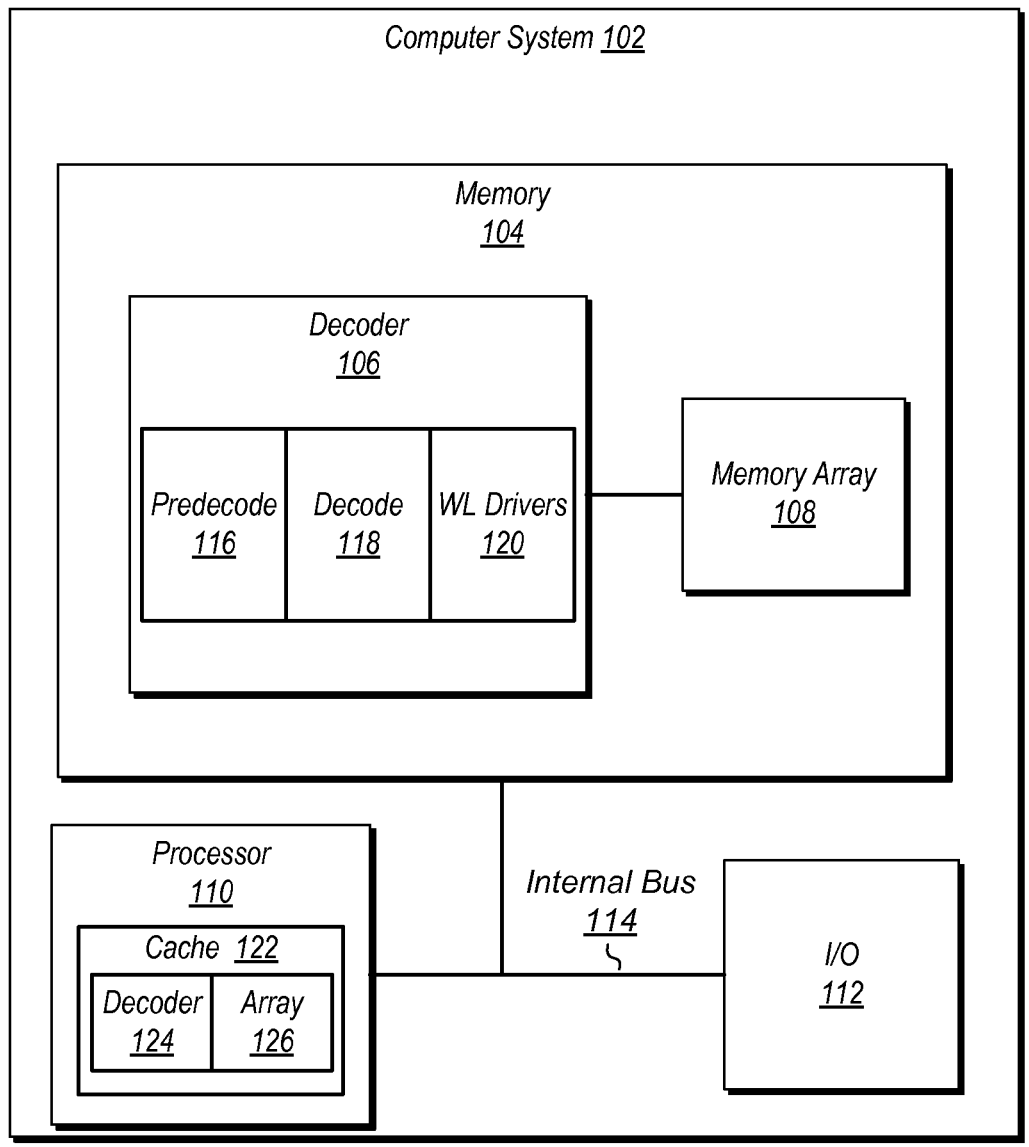
FIG. 1 sets forth a block diagram of one embodiment of computer system that includes one or more decoder circuits.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

DETAILED DESCRIPTION

FIG. 1 sets forth a block diagram of one embodiment of computer system that includes one or more decoder circuits.

The example computer system 102 of FIG. 1 includes a processor 110, coupled to an I/O (input/output) block 112 and a memory block 104 through an internal bus 114. Such a computer system 102 may be configured for use in various applications including, for example, as a mobile device, a personal desktop computer, a notebook or laptop computer, a server, and the like.

The example I/O block 112 of FIG. 1 may be configured to coordinate data transfer between the computer system 102 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, the I/O block 112 may be configured to implement a version of Universal Serial Bus (USB) protocol or IEEE 1394 (Firewire®) protocol.

The example I/O block 112 may also be configured to coordinate data transfer between the computer system 102 and one or more devices (e.g., other computer systems) coupled to the computer system 102 via a network. In some embodiments, the I/O block 112 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, the I/O block 112 may be configured to implement multiple discrete network interface ports.

The example memory block 104 of FIG. 1 may include any suitable type of memory such as a Static Random Access Memory (SRAM), a Read-only Memory (ROM), Electrically Erasable Programmable Read-only Memory (EEPROM), or a FLASH memory, for example. It is noted that in the embodiment of a computer system illustrated in FIG. 1, a single memory block is depicted. In other embodiments, any suitable number of memory blocks may be employed.

The example memory block 104 of FIG. 1 includes a decoder circuit 106 coupled to a memory array 108. The decoder circuit 106 may be configured to decode a number of address signals, such as an 8-bit address, for example. Once decoded, the decoder circuit 106 may drive one of a number of word lines of the memory array based on the decoded address. In an example embodiment in which the decoder circuit is configured to decode an 8-bit address, the decoder circuit may also be configured to drive one of 256 word lines of the memory array.

The example decoder circuit 106 of FIG. 1 includes a pre-decode stage 116, a decode stage 118, and word line driver stage 120. In some embodiments, explained below in greater detail with respect to FIGS. 2-4, the pre-decode stage may be configured to decode address signals into decode input signals for the decode stage 118. To effect such decoding, the pre-decode stage 116 may include a number of two-high, pre-decode NOR gates and one pair of inverters coupled to each pre-decode NOR gate.

In such embodiments, the decode stage 118 may be configured to decode the plurality of decode input signals into a plurality of word line driver input signals. To effect such decoding, the decode stage 118 may include a plurality of two-high NAND gates.

In the same example embodiments, the word line driver stage 120 may be configured to drive a plurality of word lines. It is noted that the phrase "configured to drive a plurality of word lines" refers to the capability of the word line driver stage to drive any one of the plurality of word lines at a given time, based on the word line driver input signals. That is, at any given time the word line driver stage is configured to drive a single word line, but is coupled to all of the word lines in such as way as to be capable of driving any of the word lines. To drive the word line, the word line driver stage may include a plurality of two-high NOR gates.

In these example embodiments, each inverter of the pre-decode stage 116 may be configured to receive one of the address signals and provide an inverted address signal to one of the pre-decode NOR gates. Each pre-decode NOR gate may be configured to receive two of the inverted address signals and output a decode input signal based on the received inverted address signals. Each NAND gate of the decode stage 118 may be configured to decode two of the decode input signals and provide one word line driver input signal to one of the two-high NOR gates of the word line driver stage 120. Each two-high NOR gate of the word line driver stage 120 may be configured to receive two of the word line driver input signals and drive a word line based on the word line driver input signals. As noted above, of the plurality of two-high NOR gates of the word line driver stage 120, only one will drive a word line at a particular time.

In some embodiments, such as those described below in greater detail with respect to FIG. 4, at least one subset of the two-high NAND gates of the decode stage 118 shares a common input and the subset is configured as multi-output static logic. In a similar manner, in some embodiments, at least one subset of the two-high NOR gates of the word line driver stage 120 shares a common input and the subset is configured as multi-output static logic.

Decoder circuits similar to those described above may be implemented in various components of the example computer system. In fact, any component that includes a memory array in which memory cells are arranged in word lines may include or be coupled to such a decoder circuit. In the computer system 102 of FIG. 1, for example, the processor 110 includes a cache 122, which includes a decoder circuit 124 similar those described above coupled to a cache memory array 126.

Although embodiments above have been described in detail, numerous variations and modifications will become apparent to those skilled in the art once the above disclosure is fully appreciated. It is intended that the claims set forth below be interpreted to embrace all such variations and modifications.

Figure 2:
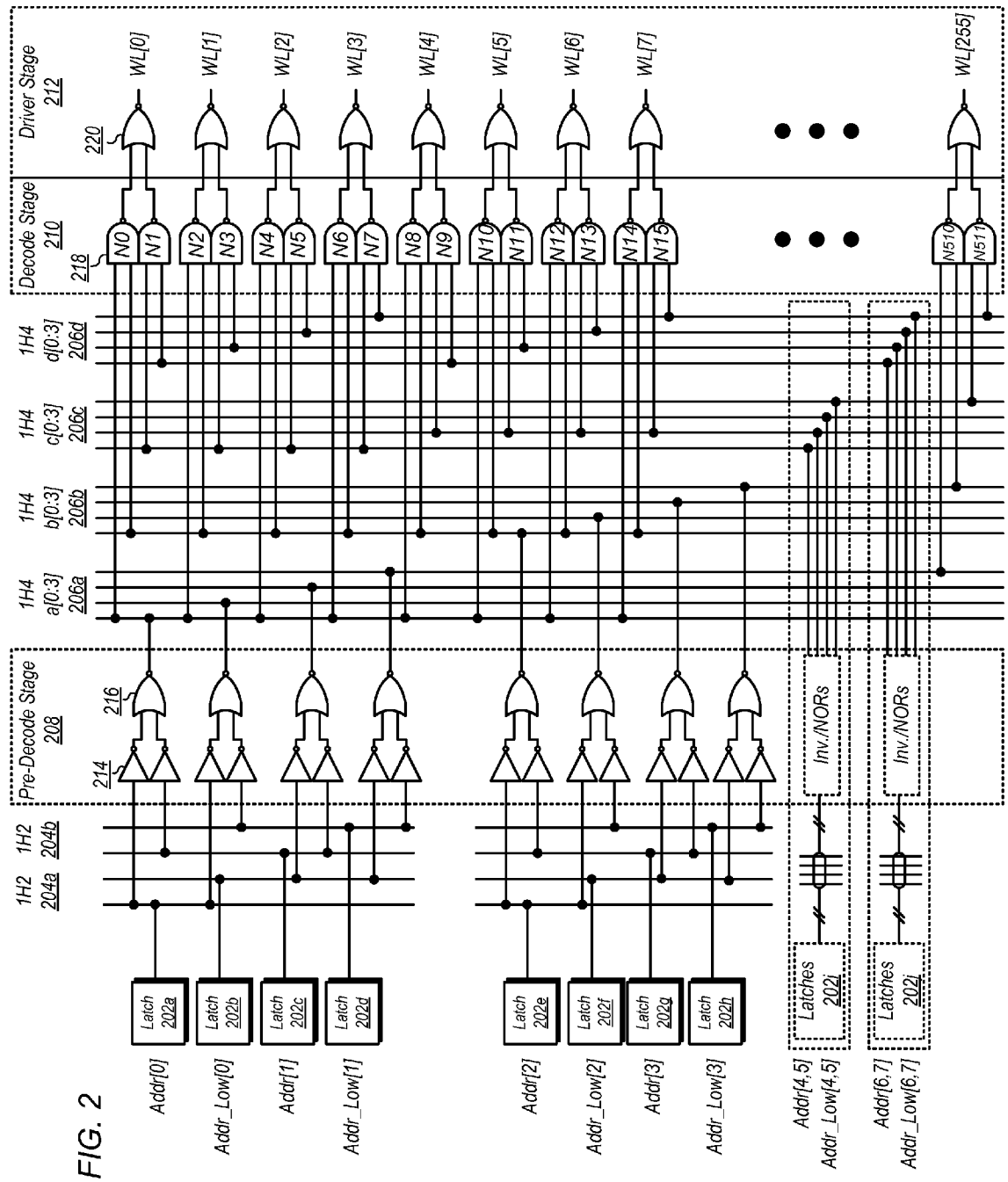
FIG. 2 sets forth a logic diagram depicting an example embodiment of a decoder circuit.
Figure 3:
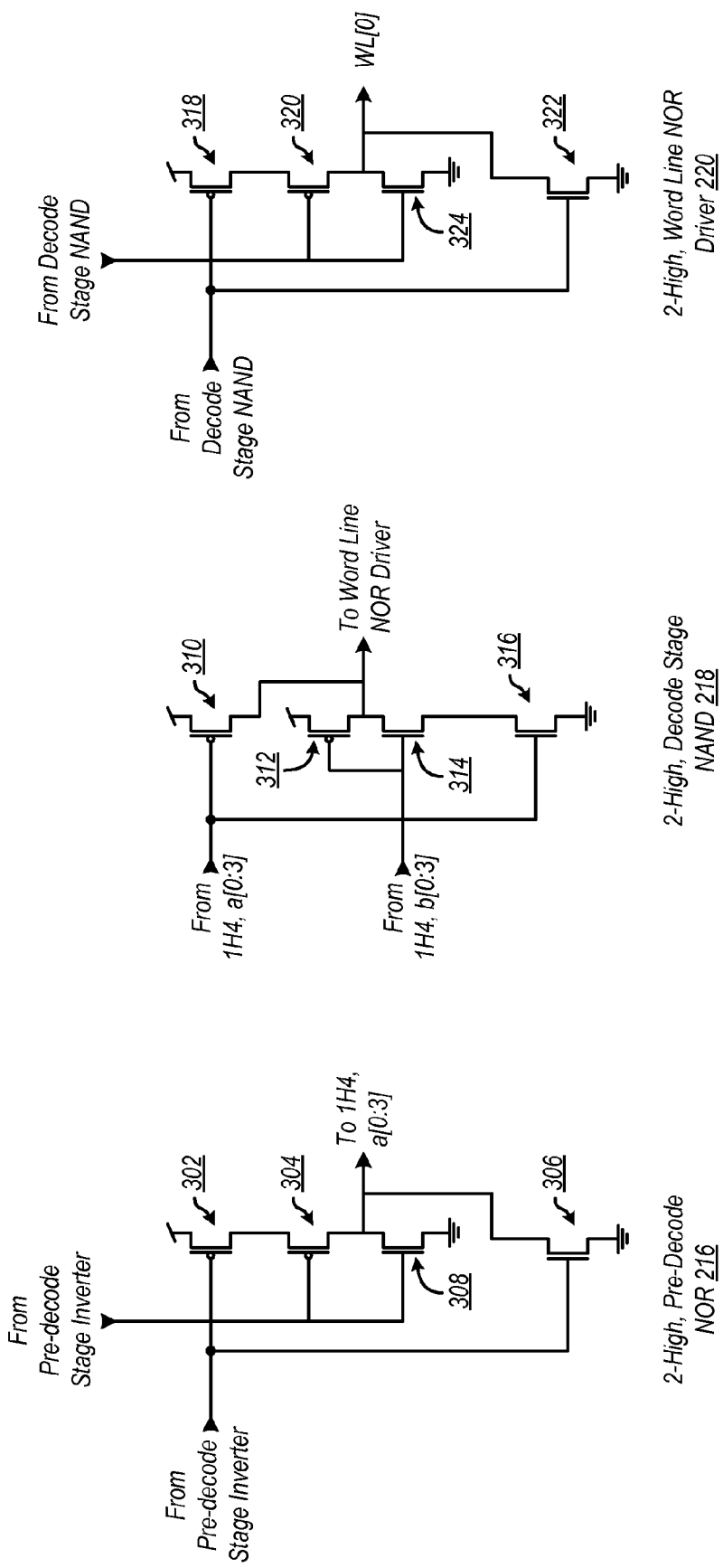
FIG. 3A sets forth circuit diagram of an example two-high NOR gate which may be utilized in the pre-decode stage of the example decoder circuit of FIG. 2.
FIG. 3B sets forth a circuit diagram of an example two-high NAND gate which may be utilized in the decode stage of the example decoder circuit of FIG. 2.
FIG. 3C sets forth a circuit diagram of an example two-high NOR gate which may be utilized in the word line driver stage of the example decoder circuit of FIG. 2.

For further explanation, FIG. 2 sets forth a logic diagram depicting an example embodiment of a decoder circuit similar to the decoder circuits described above in FIG. 1. The example decoder circuit of FIG. 2 may be configured to decode an address and drive one of a plurality of word lines based on the decoded address. In the example of FIG. 2, the decoder circuit includes a number of latches 202a-202j. Each latch 202 is configured to receive a true or complementary address bit. Latch 202a, for example, receives a true signal, Addr[0], and latch 202b receives a complementary signal, Addr_low[0].

The latches 202 in the example of FIG. 2 output an address signal to a one-hot-of-two (1H2) bus 204a, 204b. Each 1H2 bus is configured such that only one of the two lines of the bus is high (or 'hot') at any time.

The example decoder circuit of FIG. 2 may also include a pre-decode stage 208. The pre-decode stage 208 in the example of FIG. 2 includes a number of inverters 214 and a number of NOR gates 216. The inverters 214 are coupled to the 1H2 busses 204, receive the address signals output by the latches 202, and output an inverted address signal. Each inverter may also be configured to provide some gain to the inverted address signal.

In the example decoder circuit of FIG. 2, each NOR gate of the pre-decode stage 208 may be implemented as a two-high NOR gate. A gate is described as 'two-high' when at least two transistors of the gate are coupled in series. Two-high gates reduce current leakage in the example decoder circuit compared to other implementations of gates. Two-high gates, however, may reduce operational speed. To counter such reduced operational speed, one or more of the transistors of the two-high logic gates may have an increased width relative to that of a transistor in a one-high stack. In some instances, for example, one or more transistors of the two-high stack may have double the standard device width. "Standard device width," as the term is used here, refers to a width of a transistor of a one-high stack. "Double device width" refers to a transistor in a two-high gate that has a width double (or approximately so) to that of a transistor of a one-high stack. Such two-high gates are described below in greater detail with respect to FIGS. 3A, 3B, and 3C. Each NOR gate 216 in the example decoder circuit of FIG. 2 is coupled to a pair of inverters 214 and receives inverted address signals from each. Each NOR gate outputs, to a one-hot-of-four (1H4) bus 206, a decode input signal based on the received inverted address signals (in accordance with NOR operation).

The example decoder circuit of FIG. 2 also includes a decode stage 210. The decode stage includes a number of two-high NAND gates. Each NAND gate is coupled to two of the 1H4 busses to receive the decode input signals from the pre-decode NOR gates 216. Each NAND gate outputs a word line driver input signal based on the received decode input signals and in accordance with NAND operation.

The example decoder circuit of FIG. 2 also includes a word line driver stage 212. The example word line driver stage 212 includes a number of two-high NOR gates 220, one for each word line. The two-high NOR gates 220 are configured to receive the word line driver input signals from the decode stage, and based on the word line driver input signals, drive one of the word lines.

In the example of FIG. 2, the decoder circuit is configured to receive an 8-bit address, decode the address, and drive one of 256 word lines (WL[0]-WL[255]). In prior art implementations of decoder circuits, word lines are typically driven by inverters which provide a large amount of current leakage. Further, prior art decoders typically implement one inverter for each word line. The decoder circuit of FIG. 2, by contrast, includes no inverters in the word line driver stage but rather includes inverters 214 in the pre-decode stage 208. To drive each word line, the decoder circuit of FIG. 2 includes less inverters than the total number of word lines. More specifically, the decoder circuit may be configured to driver 256 word lines, but only include 32 inverters.

In addition to the current leakage reduction provided by reducing the number of inverters, the example decoder circuit of FIG. 2 may also provide current leakage reduction by implementing the logic gates as two-high logic gates. As mentioned above, two-high logic gates may provide far less current leakage than other implementations of such logic gates.

It is noted that, although the example decoder circuit of FIG. 2 is configured to decode an 8-bit address and drive one of 256 word lines, decoder circuits with reduced current leakage may be implemented in a variety of different manners, decode larger or smaller addresses, drive fewer or more word lines, and so on. It is also noted that, although FIG. 2 depicts a pre-decode stage, a decoder circuit with reduced current leakage may include a decode stage and a driver stage alone.

The example decoder circuit of FIG. 2 may include at least four current leakage reduction features. First, the driver stage may be implemented with logic gates rather than inverters. Second, the logic gates of the driver stage may be implemented as two-high logic gates. Third, the decode stage may be implemented with two-high logic gates. Fourth, the pre-decode stage may be implemented with two-high logic gates. Although all features are combined in the example decoder circuit of FIG. 2, it is noted that a decoder circuit with reduced leakage may be implemented with any combination of one or more of these current leakage reduction features.

It is also noted that prior art decode circuits typically follow a normal design methodology of "logic left, gain right," where gain may be provided by inverters in later stages of the circuit. The example circuit of FIG. 2 follows an contrasting methodology of "gain left, logic right" in that the circuit includes inverters providing gain in an early stage, followed by logic and decoding in later stages.

For further explanation, FIG. 3A sets forth circuit diagram of an example two-high NOR gate which may be utilized in the pre-decode stage of the example decoder circuit of FIG. 2. The example two-high NOR gate 216 in the example of FIG. 3A includes two p-type Field Effect Transistors (PFETs) 302, 304 coupled in series. The example two-high NOR gate also includes two n-type FETs (NFETs) 308, 306 coupled in parallel. The PFET 302 and NFET 306 receive a signal from a pre-decode stage inverter (via a 1H2 bus) and the PFET 304 and NFET 308 receive a signal from a separate pre-decode stage inverter. The example two-high NOR gate 216 of FIG. 3A outputs a signal to a 1H4 bus, such as the a[0:3] bus 206a depicted in FIG. 2.

FIG. 3B sets forth a circuit diagram of an example two-high NAND gate which may be utilized in the decode stage of the example decoder circuit of FIG. 2. The example two-high NAND gate 218 of FIG. 3B includes two PFETs 310, 312 coupled in parallel. The example two-high NAND gate 218 of FIG. 3B also includes two NFETs 314, 316 coupled in series. The PFET 310 and NFET 316 receive a signal from a 1H4 bus, such as bus 206a depicted in FIG. 2. The PFET 312 and NFET 314 receive a signal from a separate 1H4 bus, such as the bus 206b depicted in FIG. 2. The example two-high NAND gate 218 of FIG. 3B outputs a word line driver input signal to a NOR gate in a word line driver stage of a decoder circuit.

FIG. 3C sets forth a circuit diagram of an example two-high NOR gate which may be utilized in the word line driver stage of the example decoder circuit of FIG. 2. The example two-high NOR gate of FIG. 3C includes two PFETS 318, 320 coupled in series and two NFETS 322, 324, coupled in parallel. The PFET 318 and NFET 322 receive a signal from one of the NAND gates of the decode stage. The PFET 320 and NFET 324 receive a signal from a separate one of the NAND gate of decode stage. The output of the example two-high NOR gate of FIG. 3C is coupled to a word line and is configured to drive the word line based on the inputs from the decode stage NAND gates.

Figure 4:
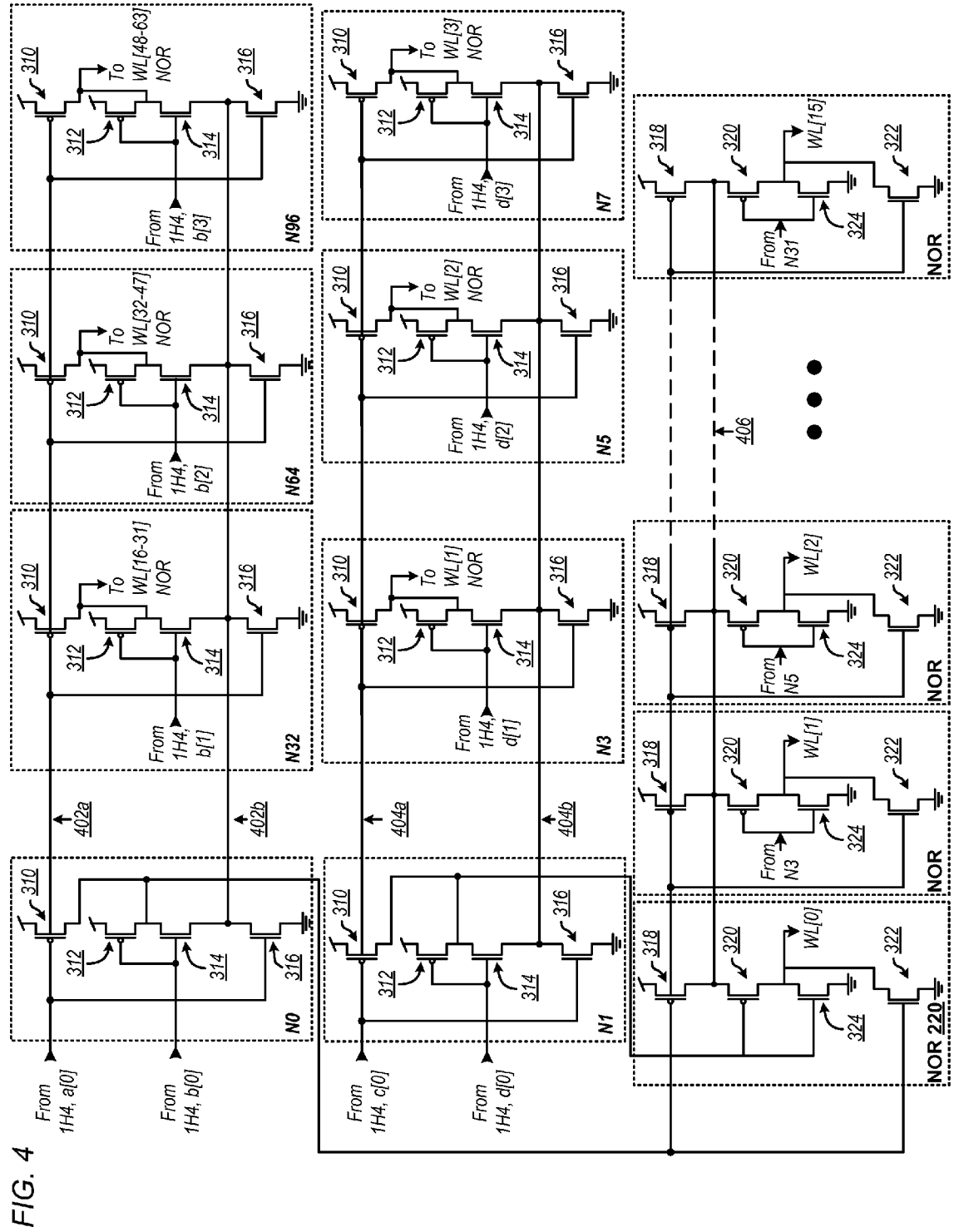
FIG. 4 sets forth a circuit diagram of an example portion of the decode stage and driver stage of the example decoder circuit of FIG. 2, implemented with multi-output static logic.

For further explanation, FIG. 4 sets forth a circuit diagram of an example portion of the decode stage and driver stage of the example decoder circuit of FIG. 2, implemented with multi-output static logic. Multi-output static logic, or MOSL, refers to an implementation of static logic in which a logic tree efficiently "shares" common terms. The example circuit of FIG. 4 includes several logic gates configured with MOSL.

The example circuit of FIG. 4 includes eight NAND gates (N0, N2, N4, N6, N1, N3, N5, and N7) of the decoder stage depicted in the example decoder circuit of FIG. 2. The example circuit of FIG. 4 also depicts sixteen NOR gates 220 of the word line driver stage of the example decoder circuit of FIG. 2.

In the example circuit of FIG. 4, NAND gates N0, N32, N64, and N96 share a common input term, signal a[0] (depicted as 402a) of the 1H4 bus 206a of FIG. 2. Each of the four NANDs also receives a signal from the 1H4 bus 206b. Because only one of the signals b[0] to b[3] will be active at a particular time, each of these NANDs operates uniquely. A common physical trace is included from the 1H4 bus 206a to each of the NAND gates N0, N32, N64, and N96 in the example circuit of FIG. 4 as well as a shared node or 'bridge' 402b between the four NAND gates. Such a bridge is a physical connection, reducing overall device width in the physical circuit. Logically, the NFET 316 of each of the NAND gates N0, N32, N64, and N96 is functionally equivalent and operates as a single NFET. Thus, as four NFETs 316 effectively operate in parallel for each of the four NAND gates, overall device width of each NFET 316 may be reduced without reducing operational speed of each of the NAND gates. Since NFET 316 is also the only leakage path to ground for NAND gates N0, N32, N64, and N96, leakage is reduced as the width of the NFETs 316 are reduced.

NAND gates N1, N3, N5, and N7 also include a common input from c[0] and are made unique by inputs from d[0]-d[3]. A bridge 404b may be implemented to reduce device width of NFET 316 in the physical circuit resulting from the c[0] input as well as reduced leakage in NAND N1, N3, N5, and N7 due to the reduced width of NFET 316.

In the example circuit of FIG. 4, the 16 word line driver NOR gates 220 share a common input at PFET 318 from N0. Effectively, PFET 318 will operate identically in each of the 16 NOR gates. That is, PFET 318 is logically 'shared' amongst the 16 NOR gates. A common physical trace is included from N0 to each of the NOR 220 gates as well as a bridge 406, between PFET 318 of each of the NOR gates 220. By bridging the sixteen separate PFETs of the NOR gates 220, the width of the PFET 318 may be reduced relative to a standard device width with a corresponding reduction in leakage of the NORS 220 due to the reduced width. Further, because the PFET is in series with another device, voltage is further divided and reduced, thus further reducing leakage. In some embodiments, the width of the PFET 318 may be eight times less than a standard device width—doubled in width due to being configured in series with another device and divided in width by 16 due to being shared over 16 NORS. In such an example embodiment, the 16 PFETs implemented with the MOSL bridge 406 will share and operate a single PFET having double device width.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A decoder circuit comprising:
   a pre-decode stage configured to decode a plurality of address signals into a plurality of decode input signals, wherein the pre-decode stage includes a plurality of two-high, pre-decode NOR gates and a respective pair of inverters for each pre-decode NOR gate;
   a decode stage configured to decode the plurality of decode input signals into a plurality of word line driver input signals; and
   a word line driver stage configured to drive a plurality of word lines, wherein the word line driver stage comprises a plurality of two-high, word line NOR gates, wherein each word line NOR gate is configured to receive two respective word line driver input signals and drive a corresponding word line based on the two respective word line driver input signals;
   wherein each inverter of each respective pair of inverters is configured to receive one address signal of the plurality of address signals and provide a respective inverted address signal to one of the pre-decode NOR gates; and
   wherein each pre-decode NOR gate of the plurality of pre-decode NOR gates is configured to receive two respective inverted address signals and output a corresponding decode input signal based on the two respective inverted address signals.

2. The decoder circuit of claim 1, wherein at least one subset of the word line NOR gates of the word line driver stage shares a common input and the at least one subset is configured as multi-output static logic.

3. The decoder circuit of claim 2, wherein at least one transistor of the at least one subset of the word line NOR gates has a width less than that of another transistor of the at least one subset of the word line NOR gates.

4. The decoder circuit of claim 1, wherein the decode stage comprises a plurality of two-high NAND gates, wherein each NAND gate of the plurality of two-high NAND gates is configured to decode two respective input signals of the plurality of decode input signals and provide one corresponding word line driver input signal to one respective word line NOR gate of the word line driver stage.

5. The decoder circuit of claim 4, wherein at least one subset of the plurality of two-high NAND gates of the decode stage shares a common input and the at least one subset is configured as multi-output static logic.

6. The decoder circuit of claim 5, wherein at least one transistor of the at least one subset of the plurality of two-high NAND gates is shared among the at least one subset and the at least one transistor has a width less than that of other transistors of the at least one subset of the plurality of two-high NAND gates.

7. The decoder circuit of claim 4, wherein
   each transistor of each word line NOR gate of the word line driver stage has a width greater than a standard device width;
   wherein each transistor of each two-high NAND gate of the decode stage has a width greater than the standard device width; and
   wherein each transistor of each pre-decode NOR gate of the pre-decode stage has a width greater than the standard device width.

8. The decoder circuit of claim 1, wherein the plurality of address signals comprises pairs of true and complementary signals.

9. The decoder circuit of claim 1, wherein the decode stage comprises a plurality of two-high NAND gates;
   wherein each two-high NAND gate of the plurality of two-high NAND gates is configured to decode two respective decode input signals and provide one corresponding word line driver input signal to one of the word line NOR gates of the word line driver stage; and
   and wherein the decoder circuit is configured to decode eight address bits and drive 256 word lines, and wherein the eight address bits are received as sixteen address signals, including one true and one complement address signal for each of the eight address bits.

10. A decoder circuit comprising:
    a pre-decode stage configured to decode a plurality of address signals into a plurality of decode input signals, the pre-decode stage comprising a plurality of two-high, pre-decode NOR gates and a pair of inverters for each pre-decode NOR gate;

a decode stage configured to decode the plurality of decode input signals into a plurality of word line driver input signals, the decode stage comprising a plurality of two-high NAND gates;

a word line driver stage configured to drive a plurality of word lines, the word line driver stage comprising a plurality of two-high NOR gates; wherein:

each inverter is configured to receive one of the address signals and provide an inverted address signal to one of the pre-decode NOR gates;

each pre-decode NOR gate is configured to receive two of the inverted address signals and output a decode input signal based on the received inverted address signals;

each NAND gate is configured to decode two of the decode input signals and provide one word line driver input signal to one of the two-high NOR gates of the word line driver stage; and each two-high NOR gate of the word line driver stage is configured to receive two of the word line driver input signals and drive a word line based on the word line driver input signals.

11. The decoder circuit of claim 10, wherein:

at least one subset of the two-high NOR gates of the word line driver stage shares a first common input and the subset is configured as multi-output static logic, wherein the subset of multi-output static logic NOR gates share at least one transistor, the shared transistor comprising a width less than other transistors of the subset of NOR gates; and at least one subset of the two-high NAND gates of the decode stage shares a second common input and the subset of the two-high NAND gates of the decode stage is configured as multi-output static logic.

12. The decoder circuit of claim 10, wherein the plurality of address signals comprises pairs of true and complementary signals.

13. The decoder circuit of claim 12, wherein the decoder circuit is configured to decode eight address bits and drive 256 word lines, the eight address bits received as sixteen address signals, one true and one complement address signal for each of the eight address bits.

14. The decoder circuit of claim 13, wherein:

the plurality of inverters are configured to receive the address signals from one-hot-of-two busses; and the decode stage is configured to receive the plurality of decode input signals from one-hot-of-four busses.

15. A decoder circuit comprising:

a pre-decode stage configured to decode a plurality of address signals into a plurality of decode input signals, wherein the pre-decode stage comprises a first plurality of two-high logic gates and a respective pair of inverters for each of the first plurality of two-high logic gates;

a decode stage configured to decode the plurality of decode input signals into a plurality of word line driver input signals, wherein the decode stage comprises a second plurality of two-high logic gates; and a word line driver stage configured to drive a plurality of word lines, wherein the word line driver stage comprises a third plurality of two-high logic gates, wherein each of the third plurality of two-high logic gates is configured to receive two respective word line driver input signals and drive a corresponding word line based on the two respective word line driver input signals;

wherein each inverter of each respective pair of inverters is configured to receive one address signal of the plurality of address signals and provide a respective inverted address signal to a respective one of the first plurality of two-high logic gates; and wherein each of the first plurality of two-high logic gates is configured to receive two respective inverted address signals and output a corresponding decode input signal based on the two respective inverted address signals.

16. The decoder circuit of claim 15 the second plurality of two-high logic gates of the decode stage comprises multi-output static logic; and wherein the third plurality of two-high logic gates of the word line driver stage comprises multi-output static logic, wherein the multi-output static logic of the word line driver stage comprises a plurality of transistors with at least one of the plurality of transistors being shared amongst the second plurality of two-high logic gates of the decode stage, wherein the at least one shared transistor comprises a width less than the width of other transistors in the decode stage.

17. A system comprising:

a memory array comprising a plurality of word lines; and a decoder circuit, the decoder circuit comprising:

a pre-decode stage configured to decode a plurality of address signals into a plurality of decode input signals, wherein the pre-decode stage comprises a plurality of two-high, pre-decode NOR gates and a respective pair of inverters for each pre-decode NOR gate;

a decode stage configured to decode the plurality of decode input signals into a plurality of word line driver input signals; and a word line driver stage configured to drive a plurality of word lines, wherein the word line driver stage comprises a plurality of two-high, word line NOR gates, each, word line NOR gate configured to receive two respective word line driver input signals and drive a corresponding word line of the memory array based on the two respective word line driver input signals;

wherein each inverter of each respective pair of inverters is configured to receive one address signal of the plurality of address signals and provide a respective inverted address signal to one of the pre-decode NOR gates; and wherein each pre-decode NOR gate of the plurality of pre-decode NOR gates is configured to receive two respective inverted address signals and output a corresponding decode input signal based on the two respective inverted address signals.

18. The system of claim 17, wherein the decode stage comprises:

a plurality of two-high NAND gates wherein each NAND gate of the plurality of two-high NAND gates is configured to decode two respective decode input signals of the plurality of decode input signals and provide one corresponding word line driver input signal to one respective word line NOR gate of the word line driver stage.

19. The system of claim 17, wherein the memory array comprises 256 word lines.

* * * * *

UNITED STATES PATENT AND TRADEMARK OFFICE
CERTIFICATE OF CORRECTION

Page 1 of 1

PATENT NO. : 9,036,447 B2
APPLICATION NO. : 13/719773
DATED : May 19, 2015
INVENTOR(S) : Masleid et al.

It is certified that error appears in the above-identified patent and that said Letters Patent is hereby corrected as shown below:

In the specification,

In column 4, line 3, delete "as" and insert -- a --, therefor. (first occurrence)

In the claims,

In column 8, line 57, in Claim 9, before "wherein" delete "and".

In column 9, line 25, in Claim 11, delete "multi -output" and insert -- multi-output --, therefor.

In column 10, line 10, in Claim 16, before "the second" insert -- wherein --.

Signed and Sealed this
Sixteenth Day of February, 2016

Michelle K. Lee
*Director of the United States Patent and Trademark Office*